United States Patent [19]

Beelitz

[11] 4,143,359

[45] Mar. 6, 1979

[54] DECODER CIRCUIT

[75] Inventor: Howard R. Beelitz, Gillett, Pa.

[73] Assignee: RCA Corporation, New York, N.Y.

[21] Appl. No.: 856,993

[22] Filed: Dec. 2, 1977

[51] Int. Cl.² ............................................... H04Q 9/00
[52] U.S. Cl. .............................. 340/166 R; 340/167 R
[58] Field of Search ........................ 340/166 R, 167 R; 307/215

[56] References Cited

U.S. PATENT DOCUMENTS 3,914,620  10/1975  Millhollan ........................ 340/166 R Primary Examiner—Harold I. Pitts
Attorney, Agent, or Firm—H. Christoffersen; H. I. Schanzer

[57] ABSTRACT

Binary coded signals present on N input lines are decoded by means of N differential current switches. Each current switch is connected to a different one of the input lines and produces a group of $2^{(N-1)}$ outputs in-phase with its input and a group of $2^{(N-1)}$ outputs out-of-phase with its input. $2^N$ conductors interconnect the outputs of the N switches to produce $2^N$ decoded outputs, each of which represents a unique combination of the binary signals on the N input lines.

6 Claims, 4 Drawing Figures

DECODER CIRCUIT

BACKGROUND OF THE INVENTION

This invention relates to decoding circuits for converting coded information into an uncoded format.

In many digital systems (e.g. memories, computers, etc.) information is encoded to reduce the number of signal carrying lines and to provide a compact and efficient way of routing information from one section of a system to another section or from one system to another. For example, using the Binary Coded Decimal (BCD) code, N lines carrying binary coded information include $2^N$ unique combinations of the signals on the N lines. Thus, only N lines are needed to carry $2^N$ different commands. However, at some point it is necessary to decode the information on the N lines. For example, this may occur where the data on the N lines is to be used for uniquely selecting one of many word or bit lines of a memory array.

The binary information contained on the N lines must then be separated to produce $2^N$ unique outputs, with each output representing a particular combination of the N binary inputs signals, and with each output being excited (e.g. logic "1") for only one particular combination of the N input signals. To optimize the benefits of decoding, it is important that the decoding circuitry be compact, use few components and consume small amounts of power.

SUMMARY OF THE INVENTION

Circuits embodying the invention include "N" differential current switches, each connected to a different one of N input lines for decoding the signals on the N lines. Each current switch produces $2^{(N-1)}$, separate, in-phase output signals, and $2^{(N-1)}$, separate, out-of-phase output signals in response to its input signal. $2^N$ conductors interconnect the outputs of the N current switches to produce $2^N$ unique combinations of the N input signals applied to the current switches.

BRIEF DESCRIPTION OF THE DRAWINGS

In the accompanying drawing like reference characters denote like components.

DESCRIPTION OF THE PREFERRED EMBODIMENT

Figure 1:
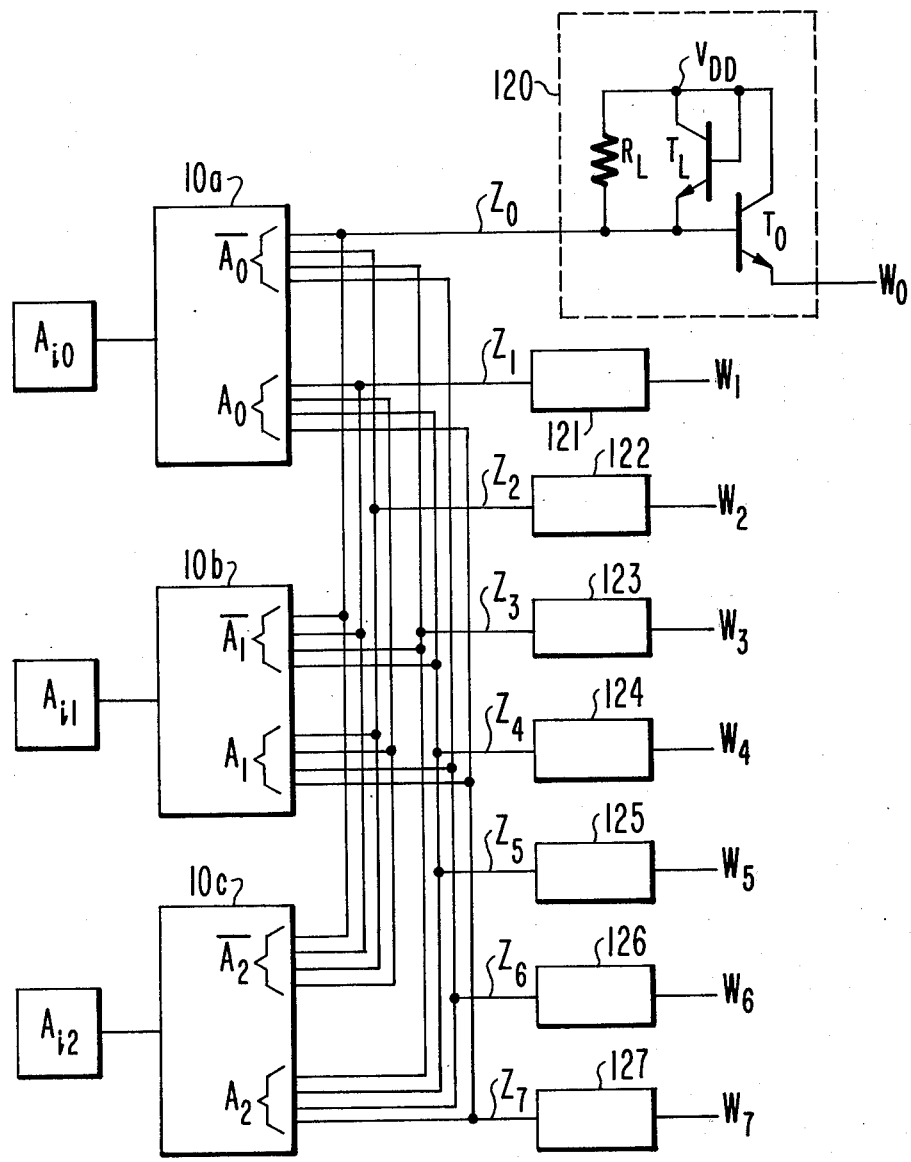
FIG. 1 is a semi-schematic, semi-block diagram of a circuit embodying the invention.
Figure 2:
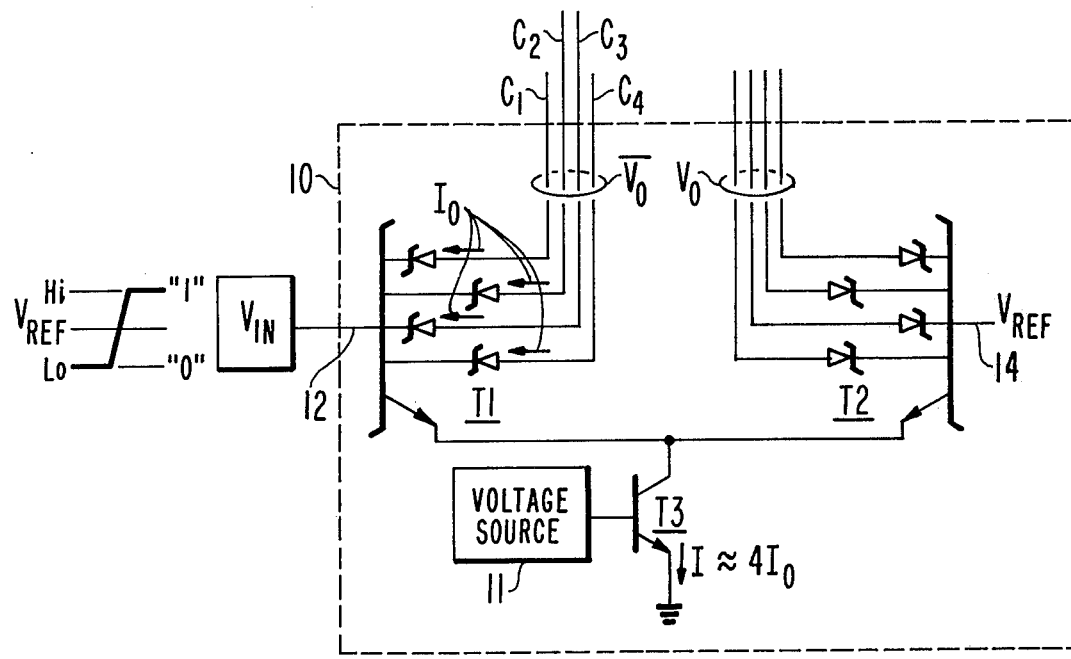
FIG. 2 is a schematic diagram of a differential current switch which may be used to practice the invention.

The circuit of FIG. 1 includes differential current switches 10a, 10b and 10c, to which are applied input signals $A_{i0}$, $A_{i1}$, and $A_{i2}$, respectively. A type of differential current switch suitable for use in the circuit of FIG. 1 is detailed in FIG. 2. Two NPN bipolar multi-collector transistors ($T_1$, $T_2$) are connected at their emitters to the collector of an NPN bipolar transistor $T_3$. The emitter of transistor $T_3$ is connected to circuit ground and a fixed voltage is applied to its base, by a voltage source 11. As a result, a substantially constant current I flows in the collector of $T_3$.

A reference signal [$V_{REF}$] is applied to the base 14 of transistor $T_2$, and an input signal ($V_{IN}$) which varies in amplitude about $V_{REF}$ is applied to the base 12 of transistor $T_1$. Those values of $V_{IN}$ less positive than $V_{REF}$ are, arbitrarily, defined as "low" or logic "0" and those value of $V_{IN}$ more positive than $V_{REF}$ are defined as "high" or logic "1."

Transistors $T_1$ and $T_2$ have multi-collectors to produce multiple outputs on different, separate, lines. In practice the number of collectors per transistor is determined by the number of input variables to be decoded. Each differentially connected transistor ($T_1$, $T_2$) has $2^{(N-1)}$ collectors for decoding N input variables, where N is the number of variables (on the input lines of FIG. 1) to be decoded and is an integer greater than one (1).

The output voltage signals ($\overline{V}_O$) produced at the collectors of $T_1$ are out-of-phase (i.e. the inverse) with the input ($V_{IN}$), while the output voltage signals ($V_O$) produced at the collectors of $T_2$ are in-phase with the input ($V_{IN}$). The $V_O$ outputs of the differential switch are not the same electrical signals as the input $V_{IN}$, but any $V_O$ output at the collectors of $T_2$ is logically equal to $V_{IN}$ and any $\overline{V}_O$ output at the collectors of $T_1$ is logically the inverse (or complement) of $V_{IN}$. Hence, in the discussion to follow the input variable ($V_{IN}$) is used interchangeably with the in-phase output ($V_O$).

For $V_{IN}$ more positive than $V_{REF}$, transistor $T_1$ is turned on and can conduct (draw or sink) via each one of its collectors a current ($I_O$) which is at most equal to one fourth (I/4) of the source current I. Transistor T2 is turned-off and draws or sinks substantially no current (except for leakage) via its collectors. For $V_{IN}$ less positive than $V_{REF}$, transistor $T_1$ is turned off and draws no collector currents while transistor $T_2$ is turned on and each one of its collectors can sink a current ($I_O$) which is at most equal to I/4.

The differential current switch thus enables the production of $2^{(N-1)}$ in-phase outputs and $2^{(N-1)}$ out-of-phase outputs efficiently and within one propagation delay of the application of an input signal to the switch.

Figure 3:
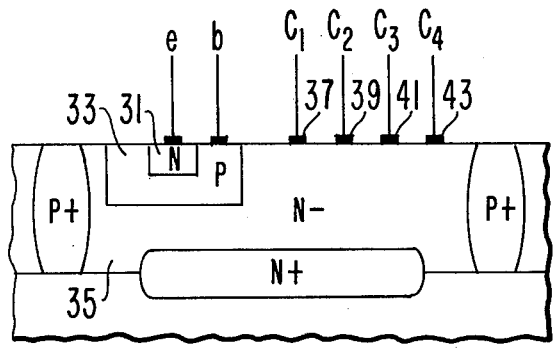
FIG. 3 is a cross sectional diagram of a transistor suitable for use in the current switch of FIG. 2.

Transistors $T_1$ and $T_2$ are illustrated as Schottky-clamped transistors and each may be formed as shown in FIG. 3.

The emitter (e) is formed by an N-type doped region 31 diffused into a P-doped region 33 forming the base (b). The base in turn is diffused into an N-doped collector region 35. A multiplicity of self-isolating collector contacts (C1, C2, C3, C4) are formed by making separate metal contacts (37, 39, 41, 43) to the collector region. The metal contacts form Schottky barrier diodes, whereby each collector contact is isolated or decoupled from the others by a normally reverse biased diode. Thus, utilizing Schottky barrier contacts to form the collectors of the differential current mode switch transistors results in an extremely small area being required for the transistors.

Returning to the circuit of FIG. 1, recall that the 3 input variables ($A_{i0}$, $A_{i1}$, $A_{i2}$) are applied, respectively, to the three current mode switches, 10a, 10b, 10c. Each current switch has four in-phase outputs ($A_0$, $A_1$, $A_2$) and four out-of-phase outputs ($\overline{A}_0$, $\overline{A}_1$, $\overline{A}_2$). As noted above, the in-phase outputs of a switch are the logical equivalent of its input variable and the out-of-phase outputs of a switch are the logical inverse of its input variable.

The number of in-phase outputs (four) and the number of out-of-phase outputs (four) per current switch are equal to each other and to $2^{(N-1)}$, where N represents the total number (N=3) of input variables to be decoded.

For the 3 input variables there are $2^N=8$ unique combinations as listed in the first three columns of the Truth Table below. The minterm expression for each combination is set forth in the fourth column of the table. The minterm expression is mechanized in FIG. 1 by providing eight output lines ($Z_0 \ldots Z_7$), each corresponding to a different combination of the 3 input variables. Each output line is connected to one output from each of the three current switches (10a, 10b, 10c) to satisfy the minterm equations of column 4 for each output line. Connecting one output from each of the three differential switches to one of the output lines performs the logic "AND" functions of the three outputs.

TRUTH TABLE

| $A_2$ | $A_1$ | $A_0$ | Interconnection of Current Switch Outputs | $W_0$ $Z_0$ | $W_1$ $Z_1$ | $W_2$ $Z_2$ | $W_3$ $Z_3$ | $W_4$ $Z_4$ | $W_5$ $Z_5$ | $W_6$ $Z_6$ | $W_7$ $Z_7$ |
|---|---|---|---|---|---|---|---|---|---|---|---|
| 0 | 0 | 0 | $Z_0 = \overline{A_0} \cdot \overline{A_1} \cdot \overline{A_2}$ | 1 | 0 | 0 | 0 | 0 | 0 | 0 | 0 |
| 0 | 0 | 1 | $Z_1 = A_0 \cdot \overline{A_1} \cdot \overline{A_2}$ | 0 | 1 | 0 | 0 | 0 | 0 | 0 | 0 |
| 0 | 1 | 0 | $Z_2 = \overline{A_0} \cdot A_1 \cdot \overline{A_2}$ | 0 | 0 | 1 | 0 | 0 | 0 | 0 | 0 |
| 0 | 1 | 1 | $Z_3 = A_0 \cdot A_1 \cdot \overline{A_2}$ | 0 | 0 | 0 | 1 | 0 | 0 | 0 | 0 |
| 1 | 0 | 0 | $Z_4 = \overline{A_0} \cdot \overline{A_1} \cdot A_2$ | 0 | 0 | 0 | 0 | 1 | 0 | 0 | 0 |
| 1 | 0 | 1 | $Z_5 = A_0 \cdot \overline{A_1} \cdot A_2$ | 0 | 0 | 0 | 0 | 0 | 1 | 0 | 0 |
| 1 | 1 | 0 | $Z_6 = \overline{A_0} \cdot A_1 \cdot A_2$ | 0 | 0 | 0 | 0 | 0 | 0 | 1 | 0 |
| 1 | 1 | 1 | $Z_7 = A_0 \cdot A_1 \cdot A_2$ | 0 | 0 | 0 | 0 | 0 | 0 | 0 | 1 |

Connected to each one of the output lines ($Z_0 \ldots Z_7$) is a respective loading network (120 ... 127) comprised of: (1) a resistor $R_L$ connected between the output line and a positive source of operating potential $+V_{DD}$. The value of $R_L$ is selected such that if one fourth of the source current (i.e. I/4) generated by current source transistor $T_3$ flows through $R_L$, a voltage drop of approximately one $V_{BE}$ (e.g. 0.7 volts) is developed across $R_L$. In the description below, a current (I/4) equal to one fourth of the current source current is defined as a unit of current. (2) a transistor $T_L$, connected as a diode in parallel with $R_L$, for clamping the voltage on the output line to $V_{BE}$ volts below $V_{DD}$; and (3) an output transistor $T_0$ connected at its base to the output line, at its collector to $+V_{DD}$, and at its emitter to a word line ($W_0 \ldots W_7$). The output transistor $T_0$ functions as an emitter follower which level shifts down, by one $V_{BE}$, the voltage at its base.

Depending on the values of input variables $A_{i0}$, $A_{i1}$, and $A_{i2}$, zero, one, two or three units of current can flow through each load network. When one unit of current flows through a load network it flows through its $R_L$. When more than one unit of current flows through a load network, the current in excess of one unit flows through the diode connected transistor in parallel with $R_L$. Each load network establishes a voltage level on its corresponding output line as a function of the load current. For zero current through the load network the output line is at, or close to, $+V_{DD}$ volts which is defined as logic "1." For one or more units of current through a load network the voltage on its output line is held at, or close to, $[V_{DD} - V_{BE}]$ volts which is defined as logic "0." Thus, in the instant example, the selected value of $R_L$ and the presence of $T_L$ set the threshold between logic "0" and logic "1" at one (1) unit of current.

In the discussion above, the leakage currents drawn by the current switches and the base current into $T_0$ are neglected. For the condition of $V_{DD}$ and $V_{DD} - V_{BE}$ on the output lines, the voltages at the emitter of the corresponding $T_0$ are $[V_{DD} - V_{BE}]$ volts and $[V_{DD} - 2V_{BE}]$ volts, respectively, which are defined as logic "1" and logic "0," respectively.

The emitters of the several transistors $T_0$ are connected to word lines $W_0 \ldots W_7$, respectively. Any one of these lines may be, for example, part of a memory array (not shown), with portions (word lines) of the memory array selected in accordance with the values of the input variables.

Figure 4:
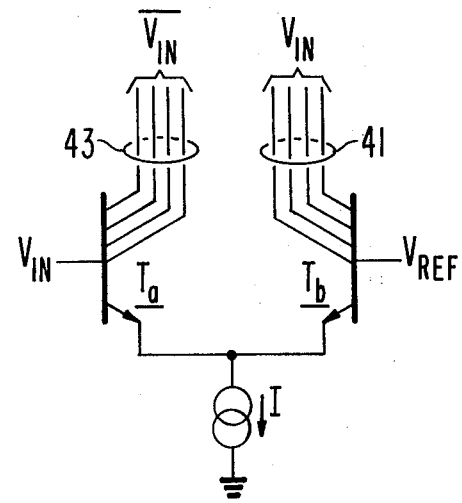
FIG. 4 is a schematic diagram of another current switch which may be used to practice the invention.

The differential current mode switch used to practice the invention may also be of the type shown in FIG. 4. Here, two transistor, $Ta$, $Tb$, each with separate collectors are differentially connected to produce, in response to a signal $V_{IN}$, a plurality of signals 41 in phase with $V_{IN}$ and a like plurality of signals 43 out-of-phase with $V_{IN}$. Note that the differential transistors need not be Schottky types.

It should be evident that a decoder embodying the invention employs very few devices, which is of critical importance in fabricating low cost, reliable, bipolar memory devices. In addition, the signal propagation path delay has been reduced to that of a single "gate" delay, considerably improving the speed performance of the decoder. This is very important in reducing the access times of memory or other devices incorporating the decoder.

What is claimed is:

1. A decoder circuit comprising:
   N input lines, each line adapted to receive an input signal; where N is an integer greater than one;
   N differential current switches, each switch having:
   (a) a first input adapted to receive an input signal;
   (b) a second input adapted to receive a reference potential; (c) $2^{(N-1)}$, distinct first outputs at which are produced signals in-phase with the signal applied to said first input; and (d) $2^{(N-1)}$ distinct second outputs at which are produced signals out-of-phase with the signal applied to said first input;
   means connecting each one of said N input lines to a respective one of said first inputs of said N current switches;
   $2^N$ conductors; means connecting each one of said $2^N$ conductors to a distinct combination of one output from each one of said N switches for producing $2^N$ different combinations of the signals present at said N input lines; and
   $2^N$ load means, each load means being connected to a respective one of said $2^N$ conductors for establishing a first level on a said conductor when all the switch outputs connected to that conductor are in one state and for establishing a second level on said one conductor when all the switch outputs connected to that conductor are not all in said one state.

2. The combination as claimed in claim 1 wherein each one of said N differential current switches comprises first and second transistors, each transistor having a base, an emitter and $2^{(N-1)}$ Schottky-barrier collector contacts, whereby each one of said $2^{(N-1)}$ collector contacts is isolated by a Schottky diode from the other collector contacts of the same transistor.

3. The combination as claimed in claim 2 wherein said emitters of said first and second transistors are connected via a relatively constant current source to a point of fixed operating potential;
   wherein the base of said first transistor is said first input of said current switch, wherein the base of second transistor is said second input of said current switch;
   wherein said $2^{(N-1)}$ collector contacts of said first transistor define said distict first outputs; and
   wherein said $2^{(N-1)}$ collector contacts of said second transistor define said distinct second ouputs.

4. The combination as claimed in claim 3 wherein each one of said $2^N$ load means includes a load resistor connected between its associated said conductor and a point of fixed operating potential, and an emitter follower connected at its input to the conductor.

5. The combination as claimed in claim 4 wherein each one of said load means includes a diode connected across the load resistor for limiting the voltage drop across the resistor.

6. The combination as claimed in claim 1 wherein each one of said N differential current switches is comprised of first and second transistors, each transistor having a base, an emitter, and $2^{(N-1)}$ collectors; each one of said $2^{(N-1)}$ collectors being junction isolated from the other collectors of the same transistor.

* * * * *